US010872852B2

(12) United States Patent
Shih

(10) Patent No.: US 10,872,852 B2
(45) Date of Patent: Dec. 22, 2020

(54) WAFER LEVEL PACKAGE UTILIZING MOLDED INTERPOSER

(71) Applicant: Micron Technology, Inc., Boise, ID (US)

(72) Inventor: Shing-Yih Shih, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/291,086

(22) Filed: Oct. 12, 2016

(65) Prior Publication Data
US 2018/0102313 A1    Apr. 12, 2018

(51) Int. Cl.
H01L 23/498    (2006.01)
H01L 21/56    (2006.01)
(Continued)

(52) U.S. Cl.
CPC ...... *H01L 23/49838* (2013.01); *H01L 21/486* (2013.01); *H01L 21/565* (2013.01); *H01L 21/6835* (2013.01); *H01L 23/3114* (2013.01); *H01L 23/49822* (2013.01); *H01L 23/49894* (2013.01); *H01L 24/16* (2013.01); *H01L 24/19* (2013.01); *H01L 21/4853* (2013.01); *H01L 21/4857* (2013.01); *H01L 23/49816* (2013.01); *H01L 23/49827* (2013.01); *H01L 2221/68331* (2013.01); *H01L 2221/68345* (2013.01); *H01L 2221/68372* (2013.01);
(Continued)

(58) Field of Classification Search
CPC ........... H01L 23/49838; H01L 21/4853; H01L 21/4857; H01L 21/486; H01L 23/3114
See application file for complete search history.

(56) References Cited

U.S. PATENT DOCUMENTS

2008/0272464 A1* 11/2008 Do ............... H01L 21/6835
  257/620
2009/0243045 A1* 10/2009 Pagaila .......... H01L 21/568
  257/621
(Continued)

FOREIGN PATENT DOCUMENTS

CN    102822942 A    12/2012
CN    103869330 A    6/2014
(Continued)

OTHER PUBLICATIONS

Taiwanese Office Action and Search Report from Taiwanese Application No. 105141171, dated Apr. 24, 2017, 14 pages with English translation.
(Continued)

*Primary Examiner* — Dale E Page
*Assistant Examiner* — Wilner Jean Baptiste
(74) *Attorney, Agent, or Firm* — TraskBritt

(57) ABSTRACT

A molded interposer includes a layer of first molding compound having a first side and a second side opposite to the first side; a first redistribution layer (RDL) structure disposed on the first side; a second redistribution layer (RDL) structure disposed on the second side; a plurality of metal vias embedded in the layer of first molding compound for electrically connecting the first RDL structure with the second RDL structure; and a passive device embedded in the layer of first molding compound.

12 Claims, 21 Drawing Sheets

(51) Int. Cl.
  *H01L 21/683* (2006.01)
  *H01L 23/00* (2006.01)
  *H01L 21/48* (2006.01)
  *H01L 23/31* (2006.01)

(52) U.S. Cl.
  CPC ............... *H01L 2224/16227* (2013.01); *H01L 2224/81005* (2013.01); *H01L 2924/1205* (2013.01); *H01L 2924/1206* (2013.01); *H01L 2924/1207* (2013.01); *H01L 2924/3511* (2013.01)

(56) References Cited

U.S. PATENT DOCUMENTS

| | | | |
|---|---|---|---|
| 2011/0037157 A1* | 2/2011 | Shin | H01L 23/49827 257/686 |
| 2011/0062549 A1* | 3/2011 | Lin | H01L 23/3128 257/531 |
| 2011/0233785 A1 | 9/2011 | Koester et al. | |
| 2012/0312584 A1* | 12/2012 | Chen | H05K 3/4694 174/251 |
| 2014/0185264 A1* | 7/2014 | Chen | H01L 23/3128 361/814 |
| 2014/0264933 A1 | 9/2014 | Yu et al. | |
| 2014/0377913 A1 | 12/2014 | Gregorich | |
| 2015/0008586 A1 | 1/2015 | Tsai et al. | |
| 2015/0123257 A1* | 5/2015 | Lin | H01L 21/563 257/678 |
| 2015/0171006 A1* | 6/2015 | Hung | H01L 24/20 257/774 |
| 2015/0287672 A1* | 10/2015 | Yazdani | H01L 21/486 257/414 |
| 2016/0007469 A1 | 1/2016 | Fu | |
| 2016/0163564 A1 | 6/2016 | Yu et al. | |
| 2017/0062383 A1* | 3/2017 | Yee | H01L 25/0652 |

FOREIGN PATENT DOCUMENTS

| | | |
|---|---|---|
| CN | 103904066 A | 7/2014 |
| CN | 104051399 A | 9/2014 |
| CN | 104282580 A | 1/2015 |
| CN | 104538381 A | 4/2015 |
| CN | 105679741 A | 6/2016 |
| TW | 201532210 A | 8/2015 |
| TW | 201532234 A | 8/2015 |

OTHER PUBLICATIONS

Decision of Rejection from Taiwanese Application No. 105141171, dated Nov. 9, 2017, 5 pages with English translation.
Chinese Office Action and Search Report from Chinese Application No. 201710002754.4, dated Apr. 1, 2019, 16 pages.
Chinese Office Action and Search Report from Chinese Application No. 201710002754.4, dated Oct. 22, 2019, 18 pages.
Chinese Office Action from Chinese Application No. 201710002754.4, dated Mar. 3, 2020, 15 pages., Mar. 3, 2020.
Chinese Notice of Reexamination for Application No. 201710002754.4, dated Sep. 30, 2020, 16 pages.

* cited by examiner

WAFER LEVEL PACKAGE UTILIZING MOLDED INTERPOSER

TECHNICAL FIELD

The present disclosure relates generally to the field of semiconductor packaging. More particularly, the present disclosure relates to a wafer level package (WLP) utilizing a molded interposer with integrated passive devices (IPDs) embedded in the molded interposer.

BACKGROUND 2.5D semiconductor package such as CoWoS (Chip-on-Wafer-on-Substrate) is known in the art. CoWoS (Chip-on-Wafer-on-Substrate) typically uses Through Silicon Via (TSV) technology to integrate multiple chips into a single device.

This architecture provides higher density interconnects, decreases global interconnect length, and lightens associated RC loading, resulting in enhanced performance and reduced power consumption on a smaller form factor.

Conventionally, the TSV silicon interposer is costly because fabricating the interposer substrate with TSVs is a complex process. Thus, forming WLP products that include a TSV interposer may be undesirable for certain applications.

Further, 2.5D semiconductor package places several dies side-by-side on a TSV silicon interposer. Passive devices such as capacitors or resistors may be mounted on the same surface on which the dies are placed. This arrangement results in a TSV interposer with a larger surface area. It is usually desirable to shrink the size of the interposer.

BRIEF SUMMARY

The present disclosure is directed to provide an improved molded interposer with a smaller size, and a semiconductor package using the same.

In one aspect of the disclosure, a molded interposer includes a layer of first molding compound having a first side and a second side opposite to the first side; a first redistribution layer (RDL) structure disposed on the first side; a second redistribution layer (RDL) structure disposed on the second side; a plurality of metal vias embedded in the layer of first molding compound for electrically connecting the first RDL structure with the second RDL structure; and a passive device embedded in the layer of first molding compound. The passive device is electrically connected to the first RDL structure through a plurality of connecting elements.

In another aspect of the disclosure, a semiconductor package includes a molded interposer as described above; and at least one semiconductor die mounted on the first RDL structure. The semiconductor die is encapsulated by a second molding compound. The first molding compound and the second molding compound have different compositions.

In still another aspect of the disclosure, a method for fabricating a semiconductor package is disclosed. A first carrier is provided. A first redistribution layer (RDL) structure is formed on the first carrier. A template layer is formed on the first RDL structure. Via openings are formed in the template layer. Metal vias are formed in the via openings. The template layer is then removed. A passive device is mounted on the first RDL structure. The passive device and the metal vias are molded with a layer of first molding compound. The layer of first molding compound is subjected to a grinding process to expose end surfaces of the metal vias. A second redistribution layer (RDL) structure is formed on the layer of first molding compound. Solder balls are formed on the second RDL structure. A semiconductor die is mounted on the first RDL structure.

These and other objectives of the present invention will no doubt become obvious to those of ordinary skill in the art after reading the following detailed description of the preferred embodiment that is illustrated in the various drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

DETAILED DESCRIPTION

Figure 1:
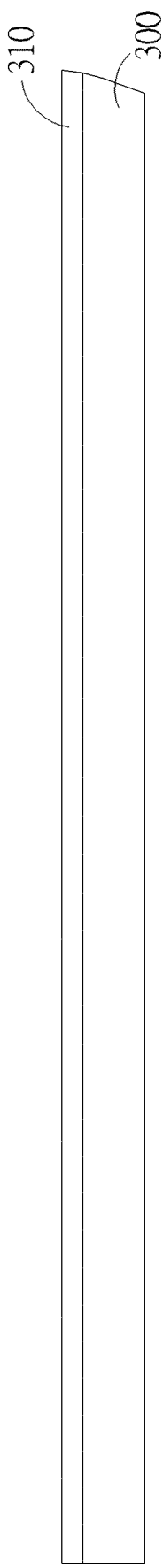
FIG. 1 through FIG. 13 are schematic diagrams showing an exemplary method for fabricating a wafer level package (WLP) utilizing a molded interposer according to one embodiment of the invention.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the accompanying drawings, wherein like reference numerals are used to refer to like elements throughout, and wherein the illustrated structures are not necessarily drawn to scale. The terms "die," "semiconductor chip," and "semiconductor die" are used interchangeably throughout the specification.

The terms "wafer" and "substrate" used herein include any structure having an exposed surface onto which a layer is deposited according to the present invention, for example, to form the circuit structure such as a redistribution layer (RDL). The term "substrate" is understood to include semiconductor wafers, but not limited thereto. The term "substrate" is also used to refer to semiconductor structures during processing, and may include other layers that have been fabricated thereupon.

FIG. 1 through FIG. 13 are schematic diagrams showing an exemplary method for fabricating a wafer level package (WLP) utilizing a molded interposer according to one embodiment of the invention.

As shown in FIG. 1, a carrier 300 is prepared. The carrier 300 may be a releasable substrate material. The carrier 300 may comprise glass, silicon, ceramic, metal, or any suitable supporting materials. At least a dielectric layer or a passivation layer 310 is provided on a top surface of the carrier 300. The passivation layer 310 may comprise organic materials such as polyimide (PI) or inorganic materials such as silicon nitride, silicon oxide or the like.

Figure 2:
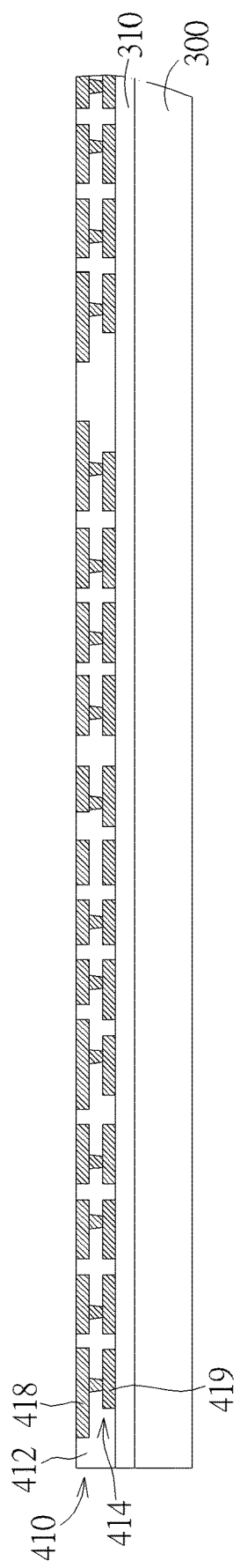

As shown in FIG. 2, subsequently, a redistribution layer (RDL) structure 410 is formed on the passivation layer 310. The RDL structure 410 acts as a front-side (or chip-side) RDL interposer that is able to fan out the input/output (I/O) pads on a semiconductor die. The RDL structure 410 may comprise at least one dielectric layer 412 and at least one metal layer 414.

According to the embodiment, the dielectric layer 412 may comprise organic materials such as polyimide (PI) or inorganic materials such as silicon nitride, silicon oxide or the like, but not limited thereto.

The metal layer 414 may comprise aluminum, copper, tungsten, titanium, titanium nitride, or the like. According to the illustrated embodiment, the metal layer 414 may comprise a plurality of fine-pitch traces, contact pads 418 exposed from a top surface of the dielectric layer 412, and contact pads 419 in direct contact with the passivation layer 310.

It is understood that the layers and layout of the metal layer 414 and the contact pads 418, 419 are for illustration purposes only. Depending upon design requirements, more layers of metal traces may be formed in the RDL structure 410 in other embodiments.

Figure 3:
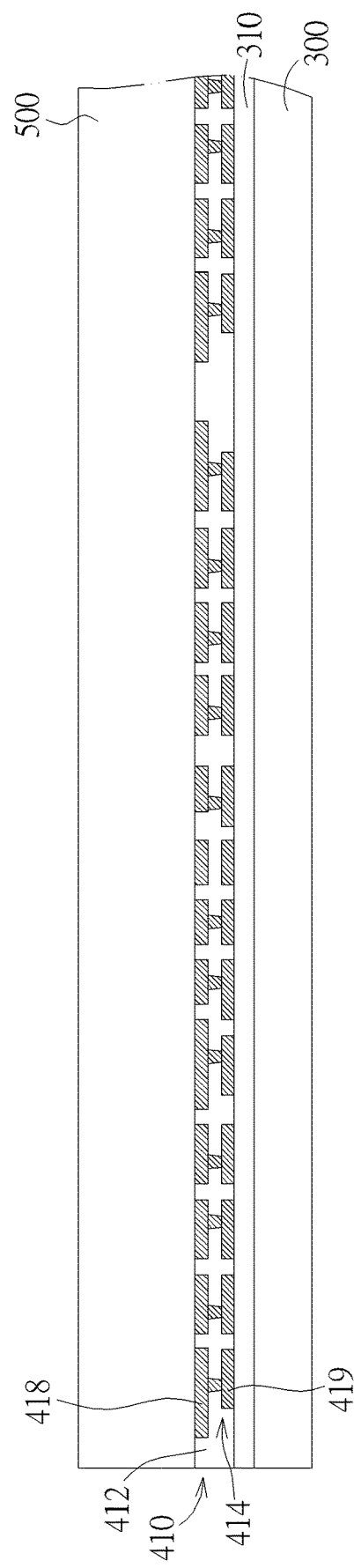

As shown in FIG. 3, a template layer 500 is coated on the RDL structure 410. For example, the template layer 500 may be a photoresist such as i-line photoresist, or a Directed Self Assembly (DSA) material, but is not limited thereto.

Figure 4:
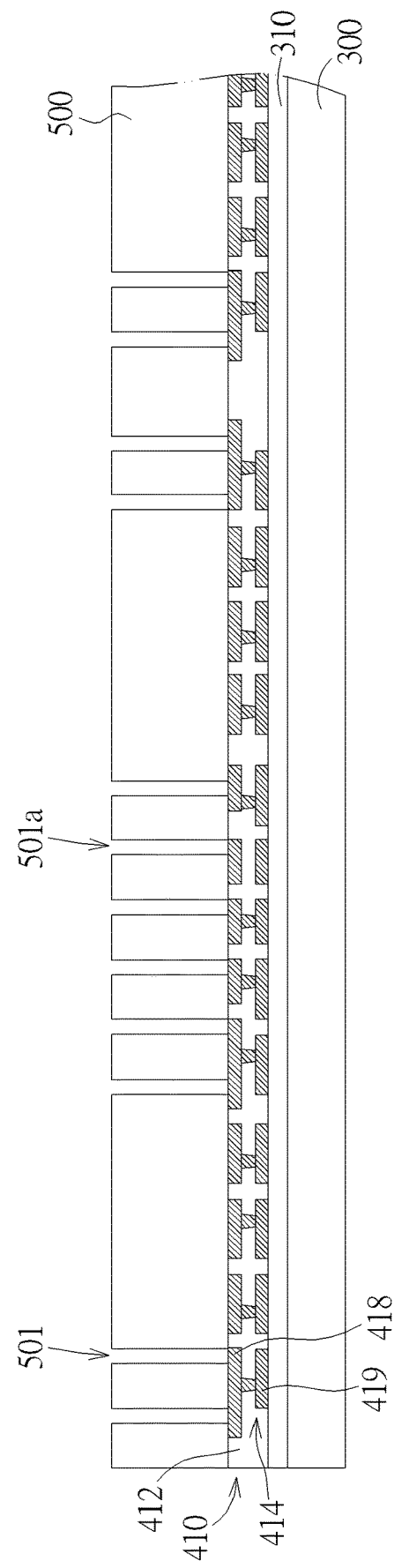

As shown in FIG. 4, via openings 501 are formed in the template layer 500. Each of the via openings 501 extends through the entire thickness of the template layer 500. According to the embodiment, the via openings 501 may expose the corresponding contact pads 418 for further connection. According to the embodiment, the via openings 501 may comprise at least one dummy via opening 501a.

To form the via openings 501, the template layer 500 containing, for example, a photoresist, may be subjected to a lithographic process including, but not limited to, a exposure process and a development process.

According to the embodiment, the via openings 501 may have the same via diameter or dimension. According to other embodiments, the via openings 501 may have different via diameters. For example, the dummy via opening 501a may have a greater via diameter than other non-dummy via openings 501.

Figure 5:
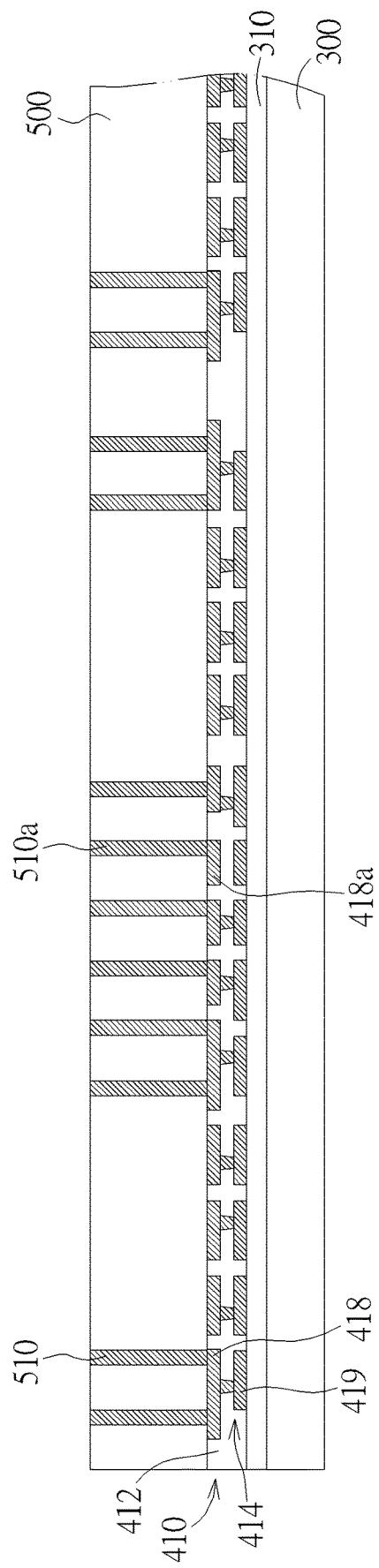

As shown in FIG. 5, after the formation of the via openings 501, metal vias 510 are formed within the via openings 501, respectively. According to the embodiment, the via openings 501 are completely filled with metal, such as copper, tungsten, aluminum, titanium, titanium nitride, or the like, to thereby form the metal vias 510. The metal vias 510 may be formed by deposition, screen printing, or any suitable methods.

According to the embodiment, the metal vias 510 may comprise at least one dummy metal via 510a formed within the dummy via opening 501a for the purposes of stress relief or warpage control. The at least one dummy metal via 510a may be disposed directly on a dummy pad 418a. The dummy pad 418a is an electrically isolated pad. No signal passes through the dummy pad 418a and the dummy metal via 510a during operation of the IC package.

Optionally, a chemical-mechanical polishing (CMP) process may be performed to remove excess metal outside the via openings 501. According to the embodiment, the metal vias 510 may have a height that is equal to the thickness t of the template layer 500.

According to the embodiment, the metal vias 510 may have the same via diameter or dimension. According to other embodiments, the metal vias 510 may have different via diameters. For example, the dummy metal via 510a may have a greater via diameter than other non-dummy metal vias 510.

According to the embodiment, the metal vias 510 may function as interconnects between the front-side RDL structure and the back-side RDL structure, heat-dissipating features, or stress-adjusting features (dummy metal vias).

Figure 6:
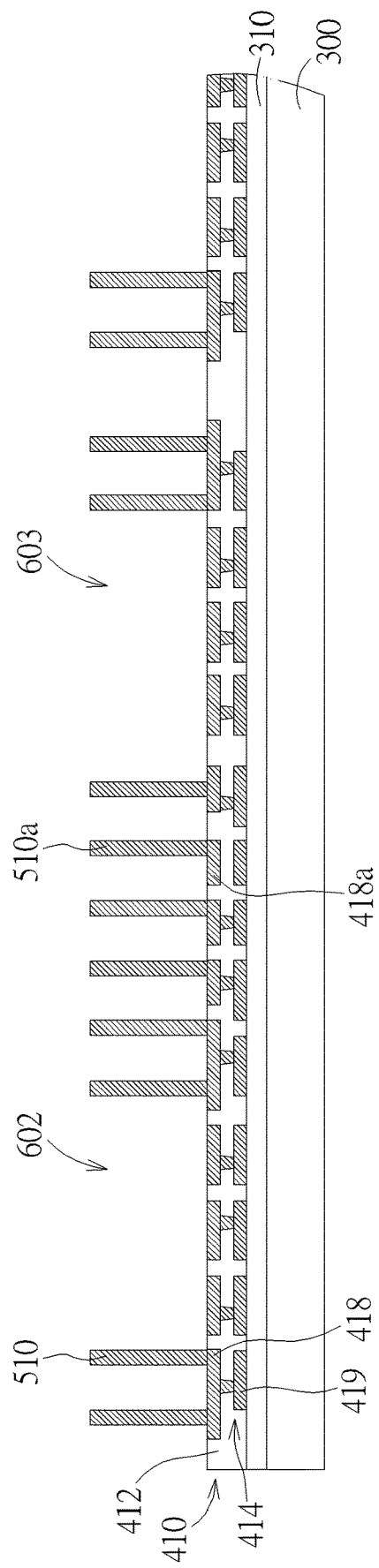

As shown in FIG. 6, after forming the metal vias 510, the template layer 500 is completely removed, leaving the metal vias 510 including the dummy metal via 510a intact. For example, the template layer 500, when containing photoresist, may be removed by plasma etching or ashing process. The contact pads 418 are exposed and the passive device mounting areas 602, 603 are defined between the metal vias 510.

Figure 7:
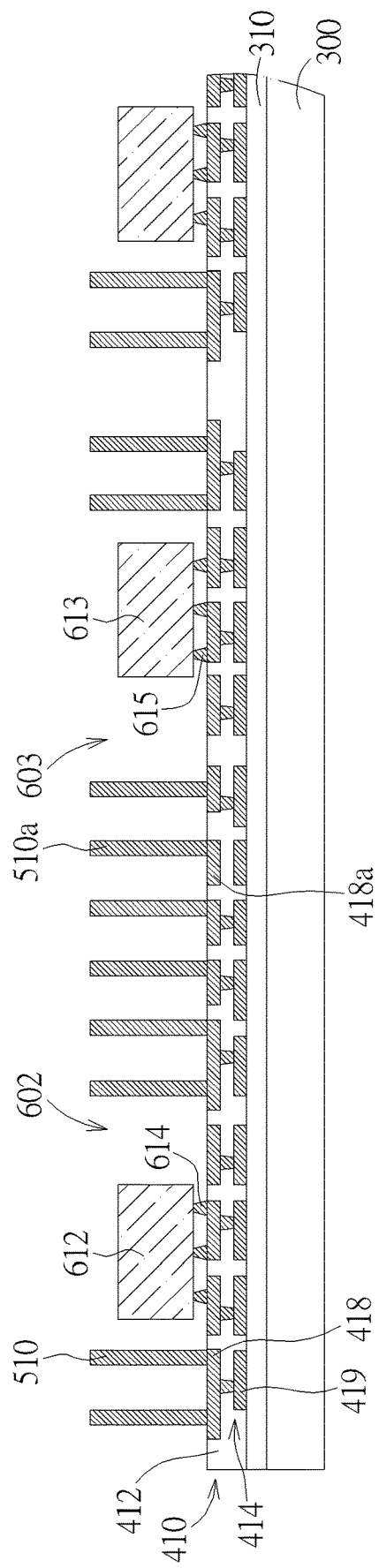

As shown in FIG. 7, a passive device 612 and a passive device 613 are mounted onto the exposed contact pads 418 within the passive device mounting areas 602, 603, respectively. The passive device 612 may be electrically connected to the contact pads 418 through the connecting elements 614, and the passive device 613 may be electrically connected to the contact pads 418 through the connecting elements 615.

According to the embodiment, the connecting elements 614, 615 may comprise solder bumps, copper bumps, microbumps, or copper pillars, but is not limited thereto. According to the embodiment, the passive devices 612, 613 may comprise capacitors, resistors, or inductors, but is not limited thereto. According to the embodiment, the passive devices 612, 613 may be mounted onto the contact pads 418 by using surface mount technique (SMT).

Figure 8:
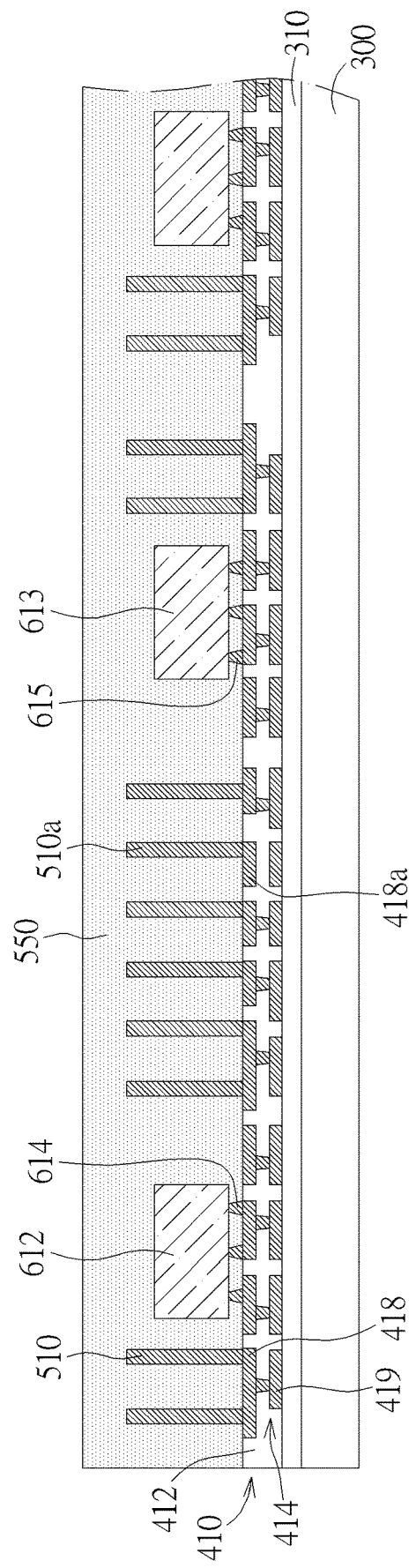

As shown in FIG. 8, a molding compound 550 is applied. The molding compound 550 covers the metal vias 510, the passive devices 612, 613, and the RDL structure 410. The molding compound 550 may be subjected to a curing process. The molding compound 550 may comprise a mixture of epoxy and silica fillers, but is not limited thereto. The layer of molding compound 550 is thicker than the thickness of the passive devices 612, 613.

Figure 9:
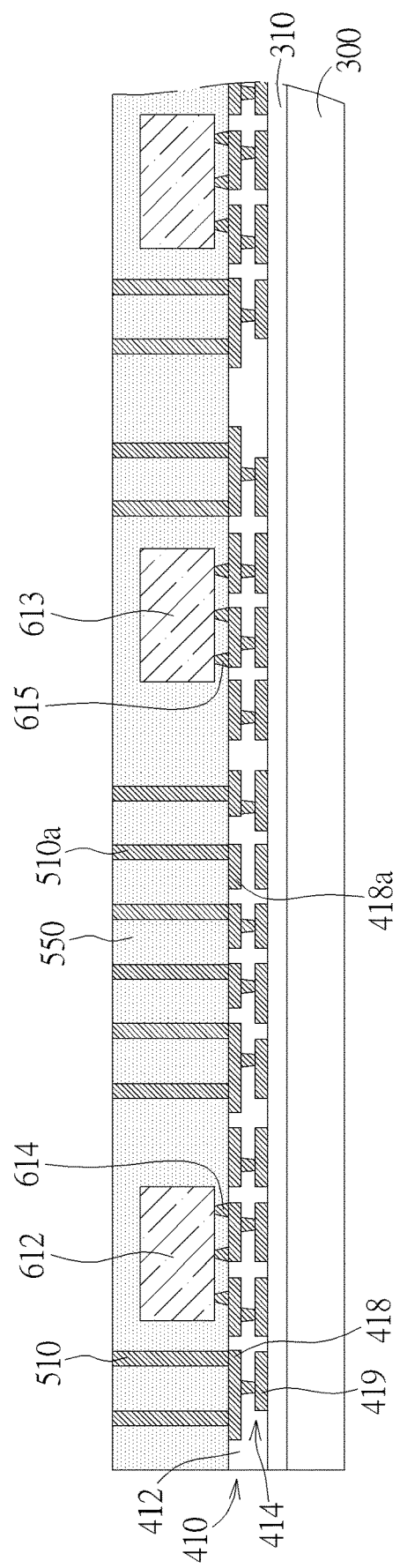

As shown in FIG. 9, a grinding process is performed. A top portion of the molding compound 550 is removed to expose top surfaces of the metal vias 510.

Figure 10:
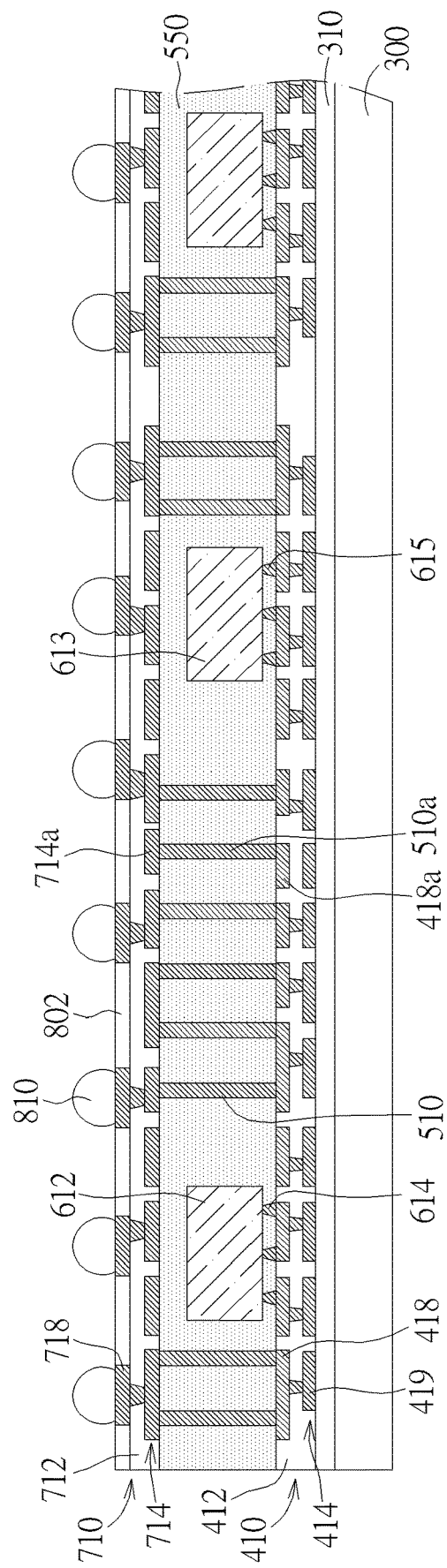

As shown in FIG. 10, a redistribution layer (RDL) structure 710 is formed on the molding compound 550 and on the metal vias 510. The RDL structure 710 acts as a back-side (or PCB-side) RDL interposer. The RDL structure 710 may comprise at least one dielectric layer 712 and at least one metal layer 714.

According to the embodiment, the dielectric layer 712 may comprise organic materials such as polyimide (PI) or inorganic materials such as silicon nitride, silicon oxide or the like, but not limited thereto.

The metal layer 714 may comprise aluminum, copper, tungsten, titanium, titanium nitride, or the like. According to the illustrated embodiment, the metal layer 714 may comprise a plurality of traces, and contact pads 718 exposed from a top surface of the dielectric layer 712. Optionally, a dummy metal layer 714a may be formed on the dummy metal via 510a. The dummy metal layer 714a is electrically isolated and is not connected to other traces of the metal layer 714.

It is understood that the layers and layout of the metal layer 714 and the contact pads 718 are for illustration purposes only. Depending upon design requirements, more layers of metal traces may be formed in the RDL structure 710 in other embodiments.

Subsequently, solder balls 810 such as ball grid array (BGA) balls are formed on the contact pads 718. It is understood that a solder mask 802 may be formed on the RDL structure 710. Prior to the formation of the solder balls 810, an under-bump metallization (UBM) layer (not explicitly shown) may be formed on the contact pads 718.

Figure 11:
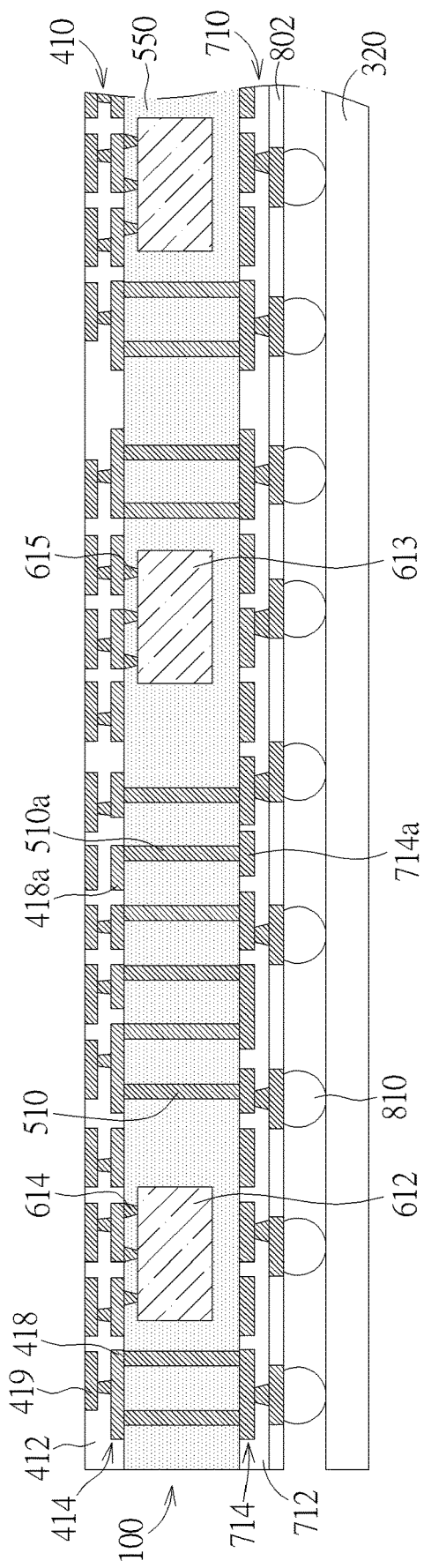

As shown in FIG. 11, after the formation of the solder balls 810, the passivation layer 310 and the carrier 300 are removed to thereby expose the contact pads 419 of the RDL structure 410. A wafer level molded interposer 100 is completed. Subsequently, a carrier 320 is bonded to the wafer level molded interposer 100. The solder balls 810 are in direct contact with the carrier 320. An adhesive layer (not explicitly shown) may be provided on the carrier 320. The carrier 320 may comprise glass, silicon, ceramic, metal, or any suitable supporting materials.

Figure 12:
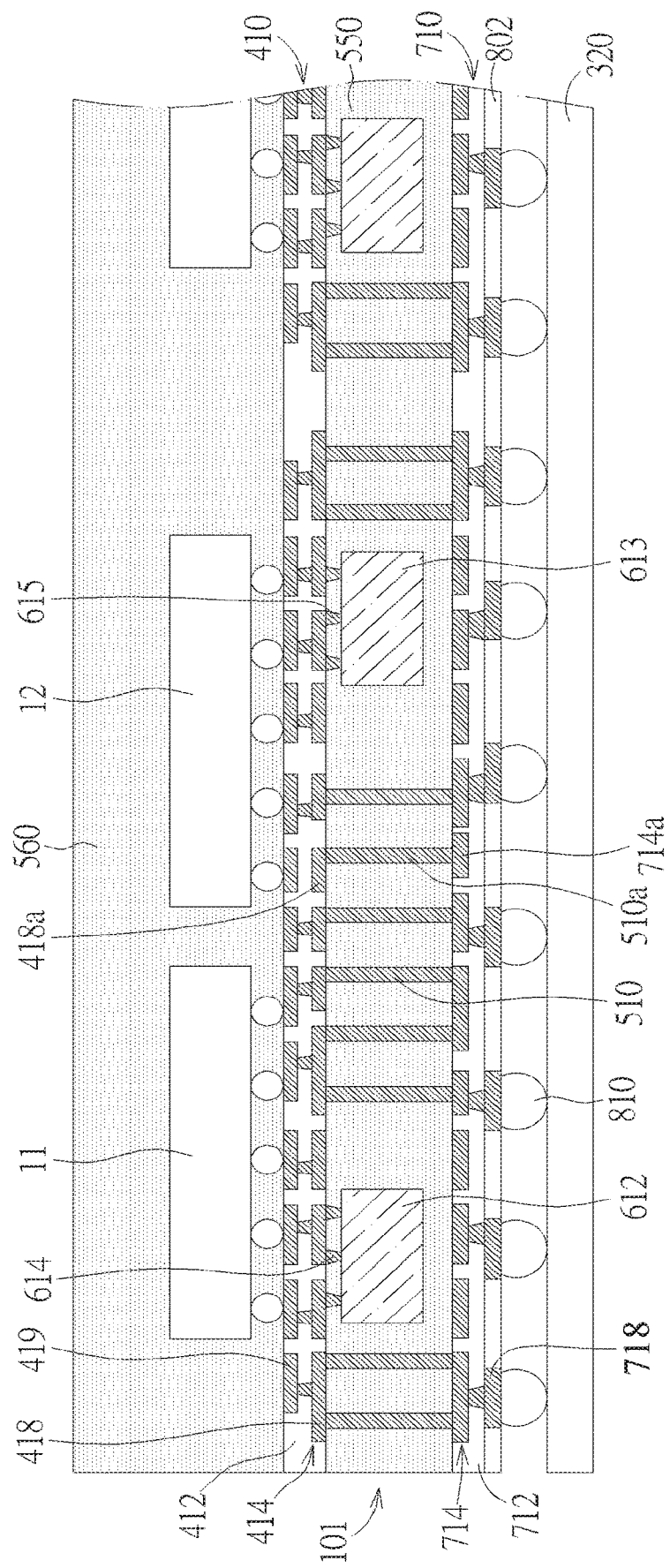

As shown in FIG. 12, a semiconductor die 11 and a semiconductor die 12 are mounted on the RDL structure 410. The semiconductor die 11 and semiconductor die 12 may be flip-chips. The semiconductor die 11 and semiconductor die 12 are electrically connected to the RDL structure 410 through the contact pads 419. The semiconductor die 11 and semiconductor die 12 are electrically connected to the RDL structure 710 through the RDL structure 410 and the metal vias 510.

Subsequently, a molding compound 560 may be formed to cover the RDL structure 410 and the semiconductor dies 11, 12, thereby forming a wafer level package 101. In order not to affect the property of the molding compound 550, the molding compound 560 may have a glass transition temperature that is lower than that of the molding compound 550.

According to the embodiment, the molding compound 560 may be cured at a lower temperature, for example, a temperature lower than the glass transition temperature of the molding compound 550. According to the embodiment, the molding compound 550 and the molding compound 560 may have different compositions. In other embodiments, the molding compound 560 may be omitted.

Figure 13:
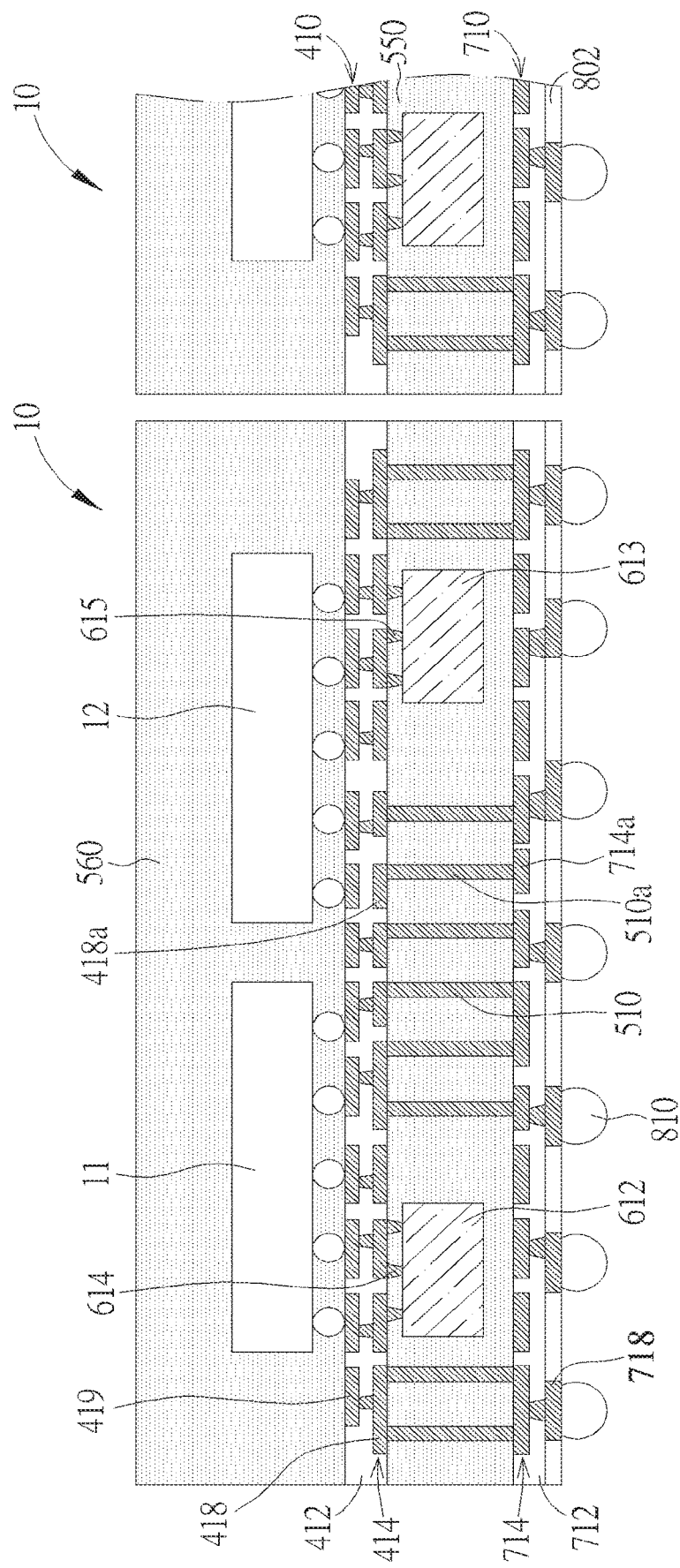

As shown in FIG. 13, wafer level package 101 is singulated into individual die package 10 by dicing. It is understood that in other embodiments each die package 10 may comprise only one die.

It is one technical feature of the invention that the passive devices 612, 613 are embedded in the molded interposer 100 and encapsulated by the molding compound 550. The overall size of the molded interposer in each die package 10 can be reduced.

FIG. 14 through FIG. 20 are schematic diagrams showing an exemplary method for fabricating a wafer level package (WLP) utilizing a molded interposer according to another embodiment of the invention, wherein like numeral numbers designate like layers, regions, or elements.

Figure 14:
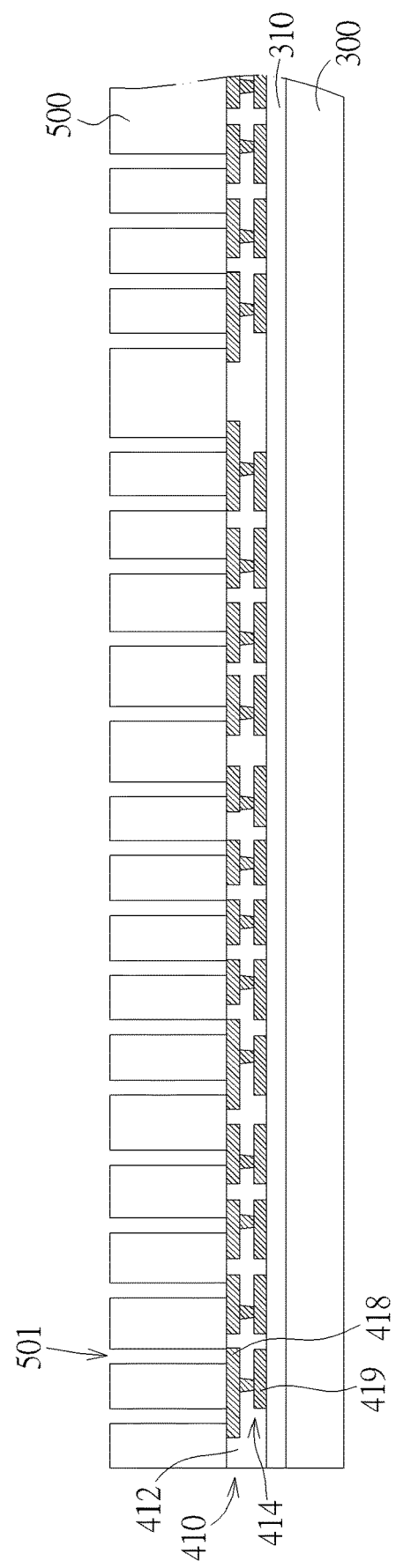
FIG. 14 through FIG. 20 are schematic diagrams showing an exemplary method for fabricating a wafer level package (WLP) utilizing a molded interposer according to another embodiment of the invention.

As shown in FIG. 14, likewise, a carrier 300 is prepared. A redistribution layer (RDL) structure 410 is formed on the passivation layer 310. The RDL structure 410 acts as a front-side (or chip-side) RDL interposer that is able to fan out the input/output (I/O) pads on a semiconductor die. The RDL structure 410 may comprise at least one dielectric layer 412 and at least one metal layer 414.

A template layer 500 is coated on the RDL structure 410. For example, the template layer 500 may be a photoresist such as i-line photoresist, or a Directed Self Assembly (DSA) material, but is not limited thereto. Via openings 501 are formed in the template layer 500. Each of the via openings 501 extends through the entire thickness of the template layer 500.

According to the embodiment, the via openings 501 may have the same via diameter or dimension. According to other embodiments, the via openings 501 may have different via diameters. According to other embodiments, some of the via openings 501 are dummy via openings.

Figure 15:
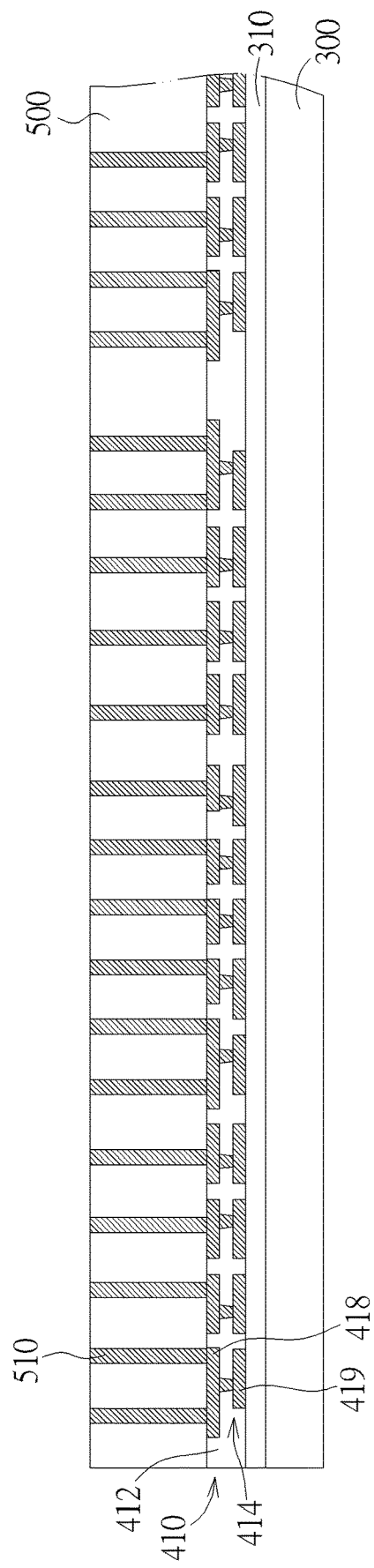

As shown in FIG. 15, after the formation of the via openings 501, metal vias 510 are formed within the via openings 501, respectively. According to the embodiment, the via openings 501 are completely filled with metal, such as copper, tungsten, aluminum, titanium, titanium nitride, or the like, to thereby form the metal vias 510. The metal vias 510 may be formed by deposition, screen printing, or any suitable methods. According to other embodiments, some of the metal vias 510 may be dummy metal vias.

Optionally, a chemical-mechanical polishing (CMP) process may be performed to remove excess metal outside the via openings 501. According to the embodiment, the metal vias 510 may have a height that is equal to the thickness t of the template layer 500.

Figure 21:
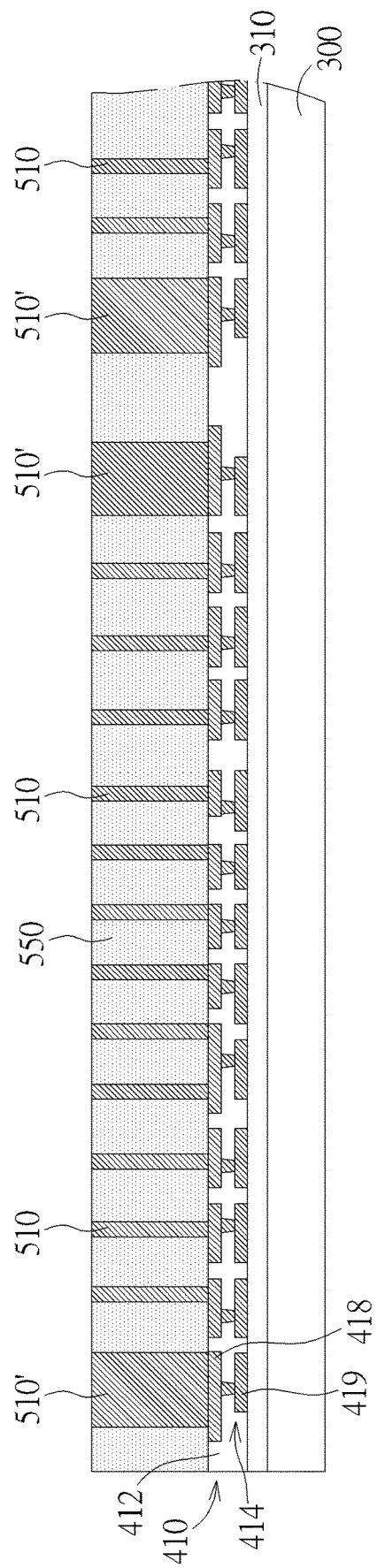
FIG. 21 shows metal vias comprising dummy metal vias, which have a greater via diameter than non-dummy metal vias.

According to other embodiments, the metal vias 510 may have different via diameters. For example, as shown in FIG. 21, the metal vias 510 may comprise dummy metal vias 510', which have a greater via diameter than non-dummy metal vias.

According to the embodiment, the metal vias 510 may function as interconnects between the front-side RDL structure and the back-side RDL structure, heat-dissipating features, or stress-adjusting features (dummy metal vias).

Figure 16:
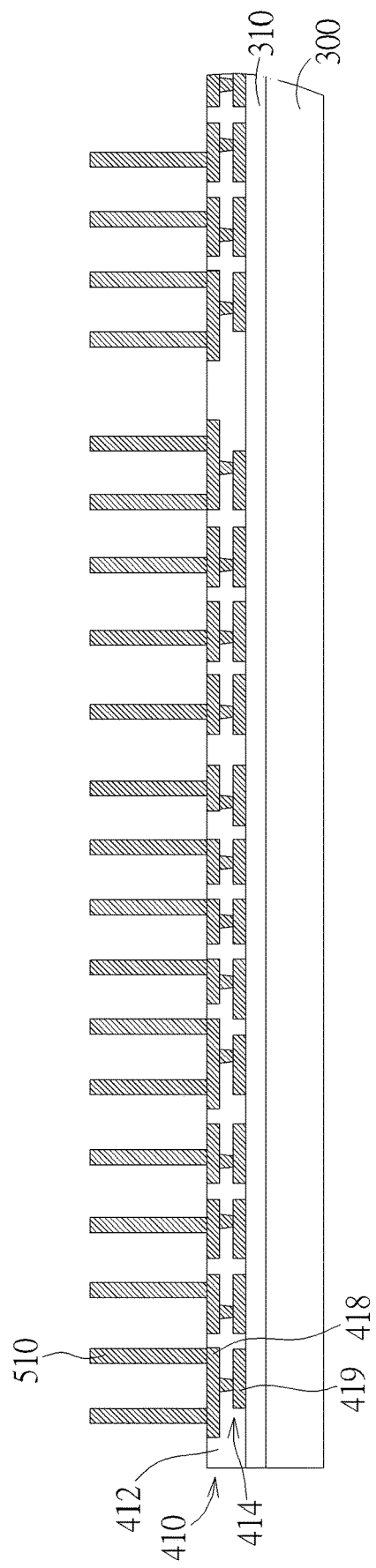

As shown in FIG. 16, after forming the metal vias 510, the template layer 500 is completely removed, leaving the metal vias 510 intact. For example, the template layer 500, when containing photoresist, may be removed by plasma etching or ashing process.

Figure 17:
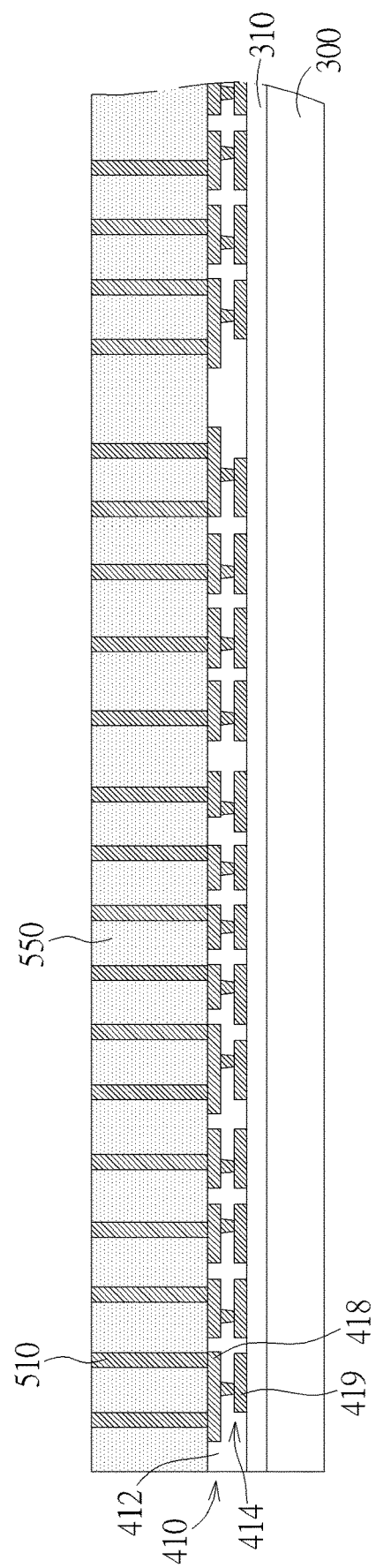

As shown in FIG. 17, a molding compound 550 is applied. The molding compound 550 covers the metal vias 510 and the RDL structure 410. The molding compound 550 may be subjected to a curing process. The molding compound 550 may comprise a mixture of epoxy and silica fillers, but is not limited thereto. A grinding process is then performed. A top portion of the molding compound 550 is removed to expose top surfaces of the metal vias 510.

Figure 18:
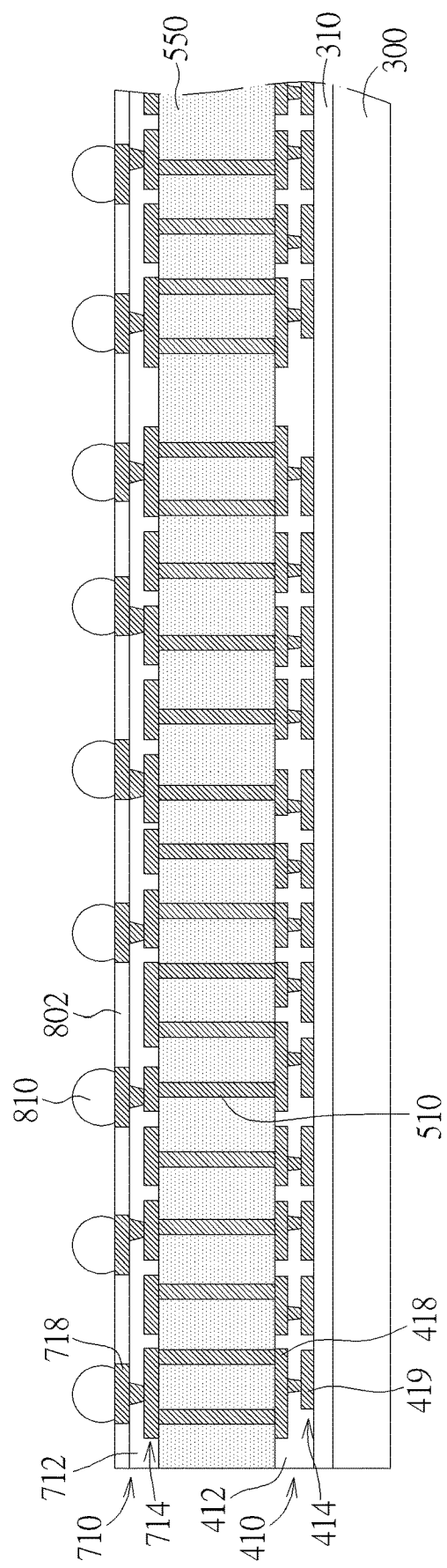

As shown in FIG. 18, a redistribution layer (RDL) structure 710 is formed on the molding compound 550 and on the metal vias 510. The RDL structure 710 acts as a back-side (or PCB-side) RDL interposer. The RDL structure 710 may comprise at least one dielectric layer 712 and at least one metal layer 714.

According to the embodiment, the dielectric layer 712 may comprise organic materials such as polyimide (PI) or inorganic materials such as silicon nitride, silicon oxide or the like, but not limited thereto.

The metal layer 714 may comprise aluminum, copper, tungsten, titanium, titanium nitride, or the like. According to the illustrated embodiment, the metal layer 714 may comprise a plurality of traces, contact pads 718 exposed from a top surface of the dielectric layer 712.

It is understood that the layers and layout of the metal layer 714 and the contact pads 718 are for illustration purposes only. Depending upon design requirements, more layers of metal traces may be formed in the RDL structure 710 in other embodiments.

Subsequently, solder balls 810 such as ball grid array (BGA) balls are formed on the contact pads 718. It is understood that a solder mask 802 may be formed on the RDL structure 710. Prior to the formation of the solder balls 810, an under-bump metallization (UBM) layer (not explicitly shown) may be formed on the contact pads 718.

Figure 19:
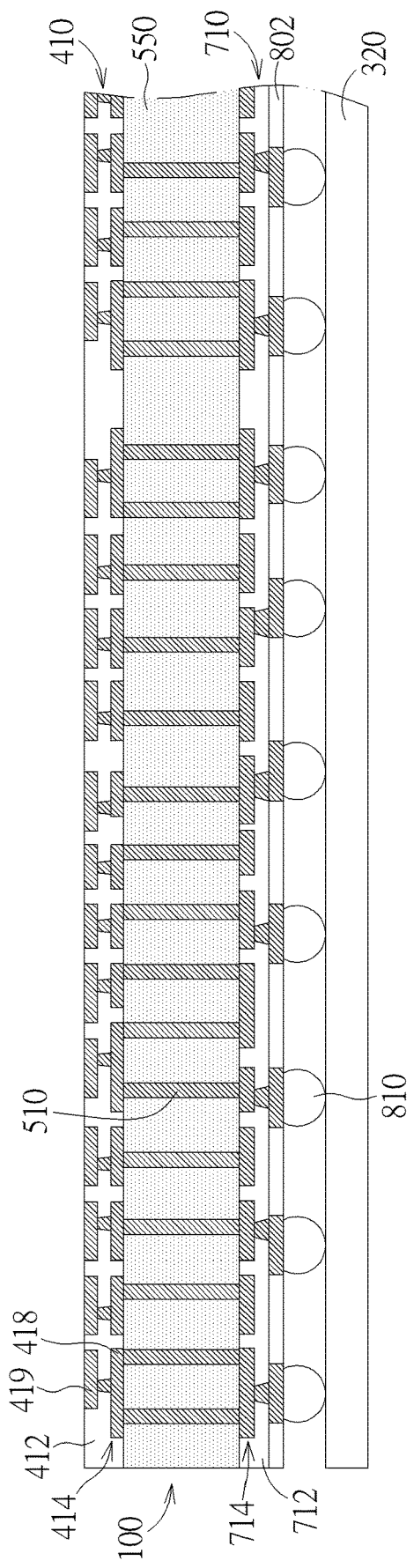

As shown in FIG. 19, after the formation of the solder balls 810, the passivation layer 310 and the carrier 300 are removed to thereby expose the contact pads 419 of the RDL structure 410. A wafer level molded interposer 100 is completed. Subsequently, a carrier 320 is bonded to the wafer level molded interposer 100. The solder balls 810 are in direct contact with the carrier 320. An adhesive layer (not explicitly shown) may be provided on the carrier 320 to adhere the solder balls 810 to the carrier 320. The carrier 320 may comprise glass, silicon, ceramic, metal, or any suitable supporting materials.

Figure 20:
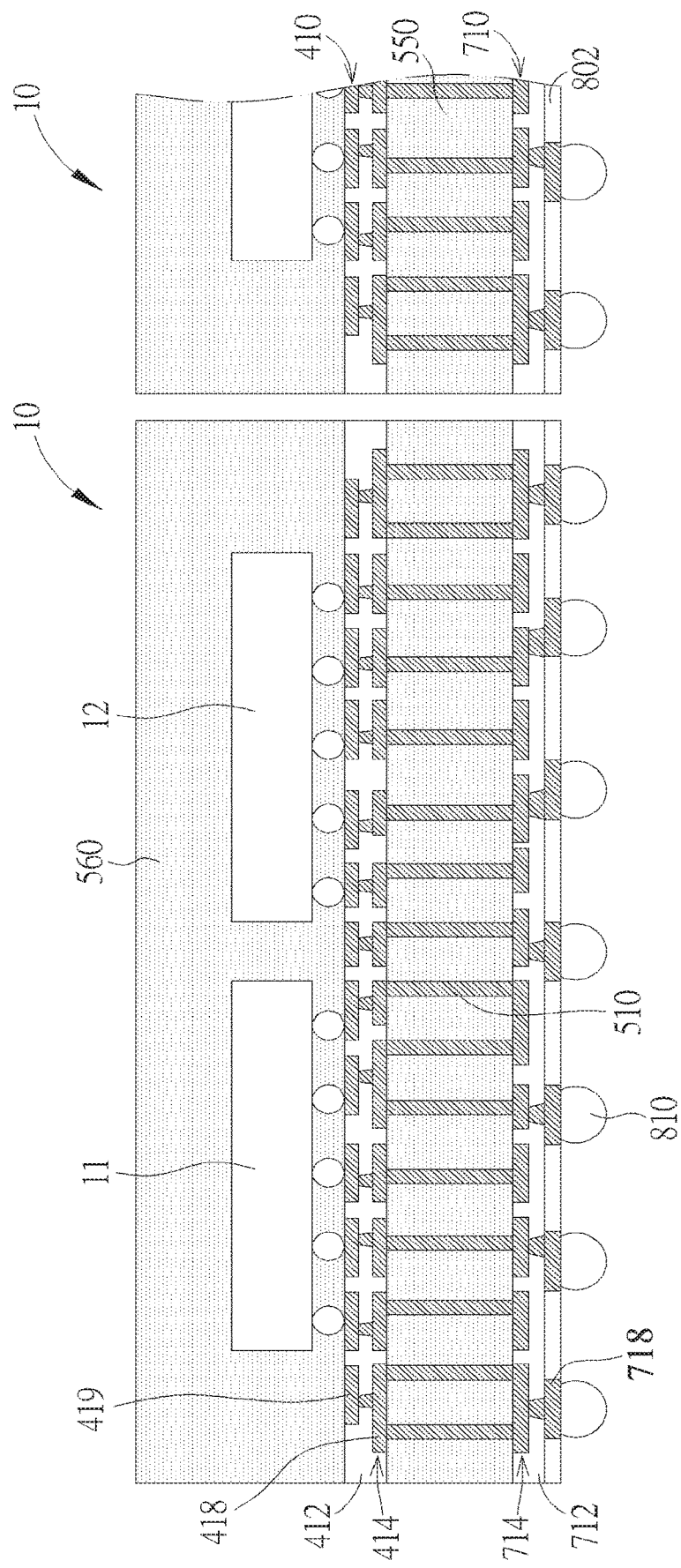

As shown in FIG. 20, a semiconductor die 11 and a semiconductor die 12 are mounted on the RDL structure 410. The semiconductor die 11 and semiconductor die 12 may be flip-chips. The semiconductor die 11 and semiconductor die 12 are electrically connected to the RDL structure 410 through the contact pads 419. The semiconductor die 11 and semiconductor die 12 are electrically connected to the RDL structure 710 through the RDL structure 410 and the metal vias 510.

Subsequently, a molding compound 560 may be formed to cover the RDL structure 410 and the semiconductor dies 11, 12, thereby forming a wafer level package. In order not to affect the property of the molding compound 550, the molding compound 560 may have a glass transition temperature that is lower than that of the molding compound 550.

According to the embodiment, the molding compound 560 may be cured at a lower temperature, for example, a temperature lower than the glass transition temperature of the molding compound 550. According to the embodiment, the molding compound 550 and the molding compound 560 may have different compositions. In other embodiments, the molding compound 560 may be omitted. The wafer level package is singulated into individual die package 10 by dicing. It is understood that in other embodiments each die package 10 may comprise only one die.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
  a molded interposer, comprising:
    a layer of first molding compound having a first side and a second side opposite to the first side;
    a first redistribution layer (RDL) structure disposed on the first side;
    a second redistribution layer (RDL) structure disposed on the second side;
    a plurality of metal vias embedded in the layer of first molding compound electrically connecting the first RDL structure with the second RDL structure; and
    passive devices, each passive device comprising a first side facing the first RDL structure and an opposite second side facing the second RDL structure, each passive device completely embedded in and completely surrounded by the layer of first molding compound, wherein each passive device is electrically connected to the first RDL structure through a plurality of connecting elements extending directly, vertically between the first RDL structure and the first side of each respective passive device, wherein the plurality of connecting elements are embedded in the layer of first molding compound and surrounded by the layer of first molding compound;
  semiconductor dice mounted on the first RDL structure and electrically connected thereto on a side of the first RDL structure opposite the passive device, each semiconductor die of the semiconductor dice being electrically connected to, and having a footprint covering, a corresponding one of the passive devices by a direct, vertical connection utilizing the plurality of connecting elements to form a face-to-face connection between each semiconductor die and the corresponding one of the passive devices; and
  a plurality of solder balls mounted on the second RDL structure.

2. The semiconductor package of claim 1, further comprising:
  a dummy metal via embedded in the layer of the first molding compound and extending between the first RDL structure and the second RDL structure, the dummy metal via being electrically isolated from signals and positioned for at least one of stress relief or warpage control of the semiconductor package.

3. The semiconductor package of claim 1, wherein the first RDL structure comprises at least one first dielectric layer and at least one first metal layer.

4. The semiconductor package of claim 3, wherein the at least one first dielectric layer comprises an organic material or an inorganic material.

5. The semiconductor package of claim 4, wherein the organic material comprises polyimide.

6. The semiconductor package of claim 4, wherein the inorganic material comprises silicon nitride or silicon oxide.

7. The semiconductor package of claim 3, wherein the at least one first dielectric layer is in direct contact with the layer of first molding compound.

8. The semiconductor package of claim 1, wherein the second RDL structure comprises a second dielectric layer and a second metal layer.

9. The semiconductor package of claim 8, further comprising a solder mask on the second RDL structure.

10. The semiconductor package of claim 1, wherein the layer of first molding compound has a thickness that is thicker than a thickness of the passive device.

11. The semiconductor package of claim 1, wherein the at least one semiconductor die is encapsulated by a layer of second molding compound on the side of the first RDL structure opposite the passive device.

12. The semiconductor package of claim 11, wherein the first molding compound and the layer of second molding compound have different compositions.

* * * * *